(12) United States Patent
Henzler et al.

(10) Patent No.: US 9,490,699 B2
(45) Date of Patent: Nov. 8, 2016

(54) DIGITALLY CONTROLLED CURRENT MODE POWER CONVERTER

(71) Applicant: Intel Mobile Communications GmbH, Neubiberg (DE)

(72) Inventors: Stephan Henzler, Munich (DE); Giacomo Curatolo, Unterhaching (DE); Marcin Daniel, Munich (DE)

(73) Assignee: Intel Deutschland GmbH, Neubiberg (DE)

( * ) Notice: Subject to any disclaimer, the term of this patent is extended or adjusted under 35 U.S.C. 154(b) by 681 days.

(21) Appl. No.: 13/803,570

(22) Filed: Mar. 14, 2013

(65) Prior Publication Data

US 2014/0266116 A1 Sep. 18, 2014

(51) Int. Cl.
G05F 1/00 (2006.01)
H02M 3/157 (2006.01)
H03M 1/66 (2006.01)
H02M 3/158 (2006.01)

(52) U.S. Cl.
CPC ............... *H02M 3/157* (2013.01); *H03M 1/66* (2013.01); *H02M 3/158* (2013.01)

(58) Field of Classification Search
CPC .... H02M 3/156; H02M 3/157; H02M 3/158; H03M 1/66
USPC .................................. 323/241, 282, 283, 322
See application file for complete search history.

(56) References Cited

U.S. PATENT DOCUMENTS

| | | | |
|---|---|---|---|
| 8,605,845 B2* | 12/2013 | Chen .......................... G06F 1/04 323/234 |
| 8,773,097 B2* | 7/2014 | Franklin ............... H02M 3/157 323/283 |
| 2009/0079090 A1 | 3/2009 | Pressel et al. |
| 2010/0008108 A1 | 1/2010 | Xiaowu et al. |
| 2010/0045256 A1 | 2/2010 | Wu |
| 2010/0060250 A1 | 3/2010 | Noda |
| 2010/0134083 A1* | 6/2010 | Trescases .............. G04F 10/005 323/283 |
| 2010/0253309 A1 | 10/2010 | Xi et al. |
| 2010/0253313 A1 | 10/2010 | Herzer et al. |
| 2011/0101932 A1 | 5/2011 | Nakazono |
| 2011/0115458 A1 | 5/2011 | Schafmeister et al. |
| 2011/0241641 A1 | 10/2011 | Chen et al. |
| 2012/0043944 A1* | 2/2012 | Nguyen .................... H02J 7/34 320/163 |
| 2012/0169307 A1 | 7/2012 | Chen et al. |
| 2013/0099761 A1* | 4/2013 | Dong ..................... H02M 3/156 323/271 |
| 2013/0257399 A1* | 10/2013 | Jiang ......................... G05F 1/10 323/271 |
| 2014/0097823 A1* | 4/2014 | Svorc .................... H02M 3/158 323/312 |

* cited by examiner

*Primary Examiner* — Jue Zhang
*Assistant Examiner* — Alex Torres-Rivera
(74) *Attorney, Agent, or Firm* — Eschweiler & Associates, LLC

(57) ABSTRACT

A current mode converter includes a converter stage comprising a first switch, a second switch, an inductor, and a capacitor, and a digital-to-analog converter configured to convert a digital target current signal to an analog current signal. The current mode converter further includes a slope compensation circuit coupled to the digital-to-analog converter and is configured to convert the analog target current signal to a slope compensated analog target signal. A comparator is coupled to the converter stage and the slope compensation stage and is configured to generate and output a signal when a value of an actual analog signal is equal to a value of the slope compensated analog target signal.

10 Claims, 5 Drawing Sheets

(a)

(b)

(c)

DIGITALLY CONTROLLED CURRENT MODE POWER CONVERTER

FIELD

The present disclosure relates to a digitally controlled current mode power converter, a current mode converter, a digital to analog converter, and a method for digitally controlling a current mode power converter.

BACKGROUND

The power supply and voltage regulation for devices such as, for example, a central processing unit, analog/RF subsystems, a memory, systems-on-chip, or peripheral loads becomes a major challenge due to increasing demands in computing, control, and communication platforms. Recent years show an increasing demand for power supply and power converters providing high dynamic characteristics. One important challenge to power supplies is to enable a fast response to strong load and line variations. For this purpose a current mode control manner can be adopted in which a current feedback circuit is further included in addition to a voltage feedback circuit or also as the only feedback circuit.

BRIEF DESCRIPTION OF THE DRAWINGS

The accompanying drawings are included to provide a further understanding of the disclosure and are incorporated in and constitute a part of this specification. The drawings illustrate embodiments and together with the description serve to explain principles of the disclosure. Other variations and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
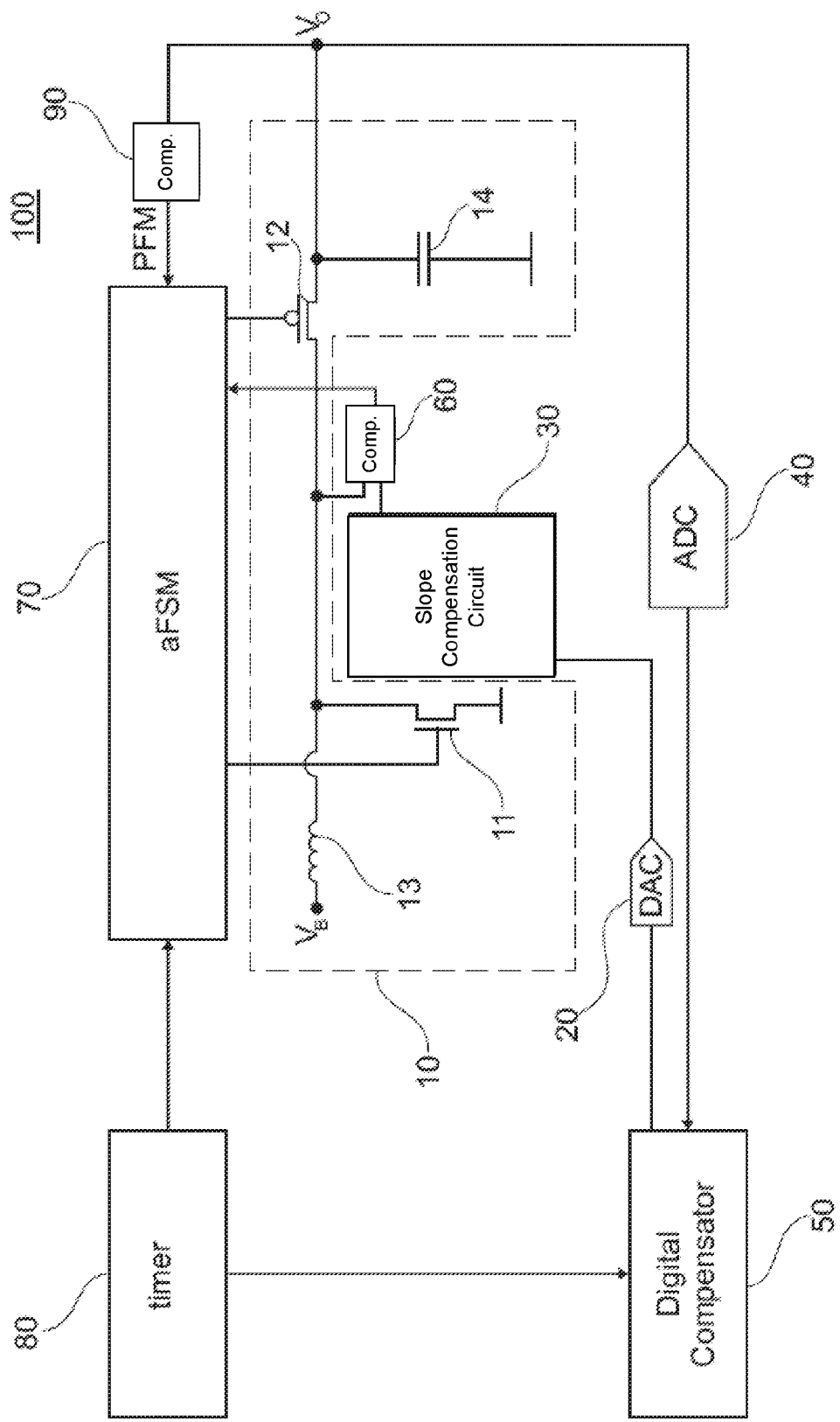
FIG. 1 illustrates a schematic block representation of a digitally controlled current mode power converter according to the disclosure.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the disclosure. It may be evident, however, to one skilled in the art that one or more aspects of the embodiments may be practiced with a lesser degree of the specific details. In other instances, known structures and elements are shown in schematic form in order to facilitate describing one or more aspects of the disclosure. It is to be understood that other embodiments may be utilized and structural or logical changes may be made without departing from the scope of the disclosure. It should be noted further that the drawings are not to scale or not necessarily to scale.

In addition, features or aspects disclosed may be combined with one or more other features or aspects of the other implementations as may be desired and advantageous for any given or particular application. The terms "coupled" and "connected", along with derivatives may be used. It should be understood that these terms may be used to indicate that two elements co-operate or interact with each other regardless whether they are in direct physical or electrical contact, or they are not in direct contact with each other. The following detailed description, therefore, is not to be taken in a limiting sense, and the scope of the present disclosure is defined by the appended claims.

The following disclosure is directed to a power converter. It is to be noted herewith that different kinds of power converters can be used like, for example, direct current to direct current power converter circuits like buck converter circuits, boost converter, or buck-boost converter circuits, direct current to alternate current converter circuits, or alternate current to direct current converter circuits.

Current controlled power converters like, for example, DC-DC converters, compare a characteristic feature such as the coil current against a threshold signal such as a threshold current which is given by a control loop. The power converter may contain a set of transistors. It may, for example, contain a first switch, for example, an n-MOS transistor, a second switch, for example, a p-MOS transistor, a coil and an output capacitor. When the threshold is reached, the first transistor switch is disabled and the second transistor switch is enabled (in the example of a boost converter). Before reaching the threshold, the coil current is increasing, and after reaching the threshold, the first and second switches reconfigure the circuit and the coil current decreases.

FIG. 1 illustrates a schematic block representation of a digitally controlled current mode power converter according to the disclosure. The power converter 100 of FIG. 1 comprises a power converter stage 10 which can be implemented as a boost converter stage as shown in FIG. 1. The power converter stage 10 comprises a first switch 11, a second switch 12, a coil 13, and an output capacitor 14. A battery voltage $V_B$ may be applied at one terminal end of the coil 13 and an output voltage $V_O$ can be obtained at an output of the power converter stage 10. The power converter 100 further comprises a digital-to-analog converter 20 comprising an input and an output and is configured to receive a digital target current signal at the input and to output an analog target current signal at the output. The digital-to-analog converter may, for example, comprise a width of 8 bit.

The power converter 100 further comprises a slope compensation circuit 30 comprising a first input and an output, wherein the first input is coupled to the output of the digital-to-analog converter 20 to receive the analog target current signal therefrom, and wherein the slope compensation circuit 30 is configured to output a slope compensated analog target current signal at the output. The slope compensation circuit 30 serves the purpose to avoid sub-harmonic oscillation at half the switching frequency by generating a threshold current value which is reduced slightly over the switching cycle. The current threshold is first calculated by a digital loop filter from the output voltage $V_O$ by converting the analog output voltage $V_O$ to a digital value in the analog-to-digital converter 40 and then calculating the current threshold in the digital compensator 50 which can, for example, be given as a PID (proportional-integral-derivative) controller. Then the digital-to-analog converter 20 generates a constant current threshold in every switching cycle. With the slope compensation circuit 30, sub-harmonic oscillations can be then avoided.

The power converter 100 further comprises a comparator 60 comprising a first input, a second input, and an output, wherein the first input is coupled to the power converter stage 10 to receive an actual analog current signal therefrom, the second input is coupled to the output of the slope compensation circuit 30, and the comparator 60 is configured to output a specific signal when a value of the actual analog current signal is equal to a value of the slope compensated analog target current signal.

The specific signal can be supplied to a controller 70 which can be implemented in the form of a finite state machine (FSM). The controller 70 may also be configured to generate and supply the control signals for the first and second switches 11 and 12.

The power converter 100 further comprises a timer 80 which can be implemented as an ultra coarse digital pulse width modulator (DPWM). The timer 80 supplies a control signal to the digital compensator 50 and a switching frequency to the controller 70. The timer can also be used to ensure minimum on-time or minimum off-time of one of the switches in the converter stage 10.

The power converter 100 may further comprise a voltage control loop comprising a further comparator 90 which receives the analog output voltage $V_O$ and compares it to a target voltage. An output signal in the form of a PFM (Pulse Frequency Modulation) signal may be supplied to an input of the controller 70. The voltage control loop is, however, only optional and can also be omitted.

Figure 2:
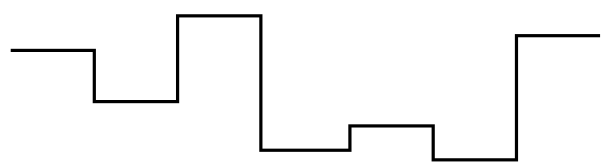
FIGS. 2a-2c show exemplary output signals of digital-to-analog converters according to the disclosure.
Figure 2:
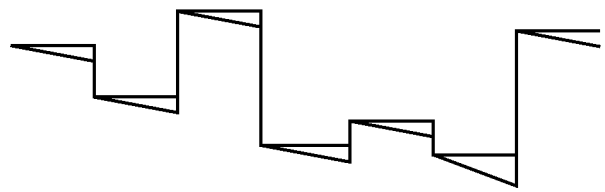
Figure 2:
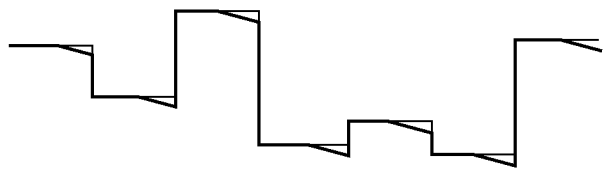

FIG. 2a shows an exemplary output signal of a digital-to-analog converter without slope compensation. The output signal is a piece-wise constant signal, i.e. a sample-and-hold version of a discrete time signal. A desirable output signal of the digital-to-analog converter is shown in FIG. 2b. It consists of the piece-wise constant component as in FIG. 2a and a continuous time ramp component. With an output signal like this, slope compensation is possible, thus sub-harmonic oscillation can be avoided. FIG. 2c shows a variant of FIG. 2b where the continuous time ramp is added only in a selectable sub-interval of the switching cycle. This may be useful if, for example, a strong ramp is desired. In an alternative implementation the continuous ramp can be replaced by another continuous waveform such as a cubic or exponential waveform.

Figure 3:
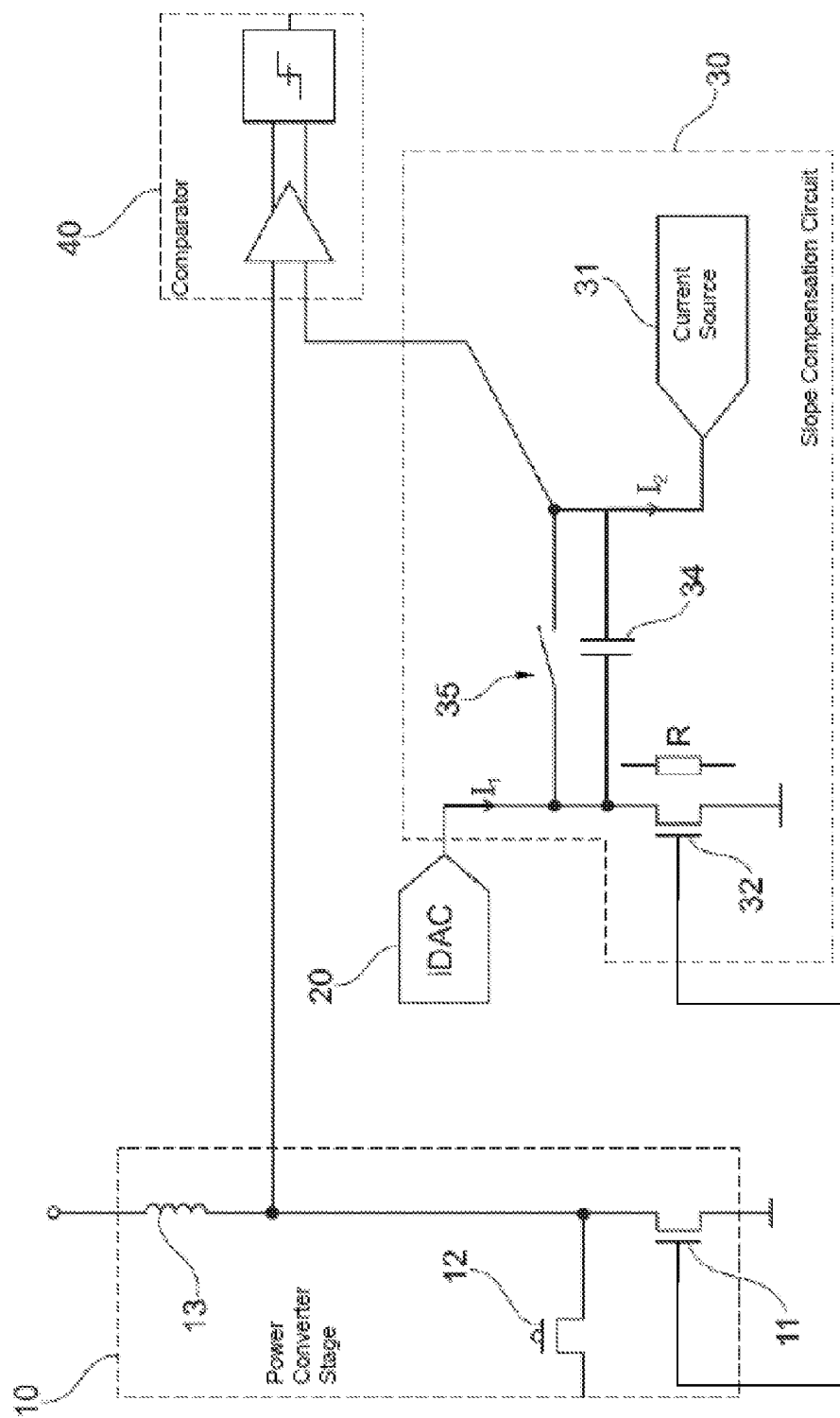
FIG. 3 illustrates a schematic block representation of a digital to analog converter for a digitally controlled current mode converter according to the disclosure.

FIG. 3 shows a schematic block representation of a digital to analog converter for a power converter according to the disclosure. In the block representation of FIG. 3, only a part of a power converter and a converter stage such as those shown in FIG. 1 are depicted. The circuit as shown in FIG. 3 comprises a power converter stage 10 comprising a first switch 11, a second switch 12, and an inductor 13. The power converter stage 10 further comprises an output capacitor (not shown). The first switch 11 can be comprised of an nMOS transistor, and the second switch 12 can be comprised of a pMOS transistor. A battery voltage $V_b$ can be applied to one terminal end of the inductor 13.

The circuit of FIG. 3 further comprises a digital-to-analog converter (DAC) 20 (first sub-DAC), a slope compensation circuit 30, and a comparator 40. Furthermore, the power converter of FIG. 3 may comprise other components which were shown in FIG. 1 and which are not shown here for the sake of simplicity. The DAC 20, the slope compensation circuit 30, and the comparator 40 may be connected with these further components in the same way as shown in FIG. 1.

The slope compensation circuit 30 comprises an input and an output, wherein the input is coupled to the output of the DAC 20 to receive the analog target current signal therefrom, and wherein the output is coupled to a first input of the comparator 40. The slope compensation circuit 30 is configured to generate a slope compensated analog target current signal and to deliver the slope compensated analog target current signal to the output. The slope compensation circuit 30 comprises a current source 31 (second sub-DAC), a first switch 32, a capacitor 34, and a second switch 35. The first switch 32 performs the function of a replica device of the first switch 11 of the power converter stage 10, which means that the first switch 11 of the power converter stage 10 and the first switch 32 of the slope compensation circuit 30 comprise a predetermined ratio of resistance values. Moreover, the control electrodes of both switches 11 and 32 are coupled to one and the same signal. The first switch 32 is furthermore coupled between the DAC 20 and ground. The first switch 32 may comprise a transistor, but may as well comprise a resistor which converts the current of the DAC 20 into a voltage. The capacitor 34 comprises a first terminal and a second terminal, wherein the first terminal is coupled to a node between the DAC 20 and the first switch 32, and the second terminal is coupled to the current source 31. The slope compensation circuit 30 further comprises a second switch 35 which functions as a reset switch, which is opened during the switching period and which is closed when the end of the switching period is reached, in order to discharge the capacitor 34 so that at the beginning of the following switching period a new ramp can be generated. At the beginning of each switching period, the DAC 20 generates an analog target current out of a digital target current and injects a current $I_1$ into the first (replica) switch 32. Then a combined effect of the current source 31 and the capacitor 34 serves for subtracting a ramp signal from the voltage probed over the first switch 32 and for feeding the resulting signal to the output of the slope compensation circuit 30. The strength or height of the ramp can be controlled by the current source 31 which can be configured as an adjustable current source 31. In particular, the current source 31 can also be configured in the form of a digital-to-analog converter (DAC) (second sub-DAC) which in this case may comprise a width of 2 or 3 bits. In an alternative embodiment neither the switch transistor 11 nor its replica transistor 32 are used for current sensing. Instead dedicated sensing devices such as sense resistors are used.

Assuming that a current $I_1$ flows from the DAC 20 through the first switch 32 to ground, the first switch 32 comprises a resistance R, the capacitor 34 comprises a capacitance C, and the current source 31 draws a current $I_2$, then the voltage across the capacitor 34 develops like $1/C \times I_2 \times t$ and the output voltage delivered to the output of the slope compensation circuit 30 develops like $R(I_1-I_2) - 1/C \times I_2 \times t$.

The current source 31 can also be operated in such a way that the ramp is added later in this switching cycle, i.e. not from the very beginning. Such an example was shown in the time diagram of FIG. 2c. In an embodiment the slope is activated before an estimated time instance of equality of the analog target current and the actual current.

Figure 4:
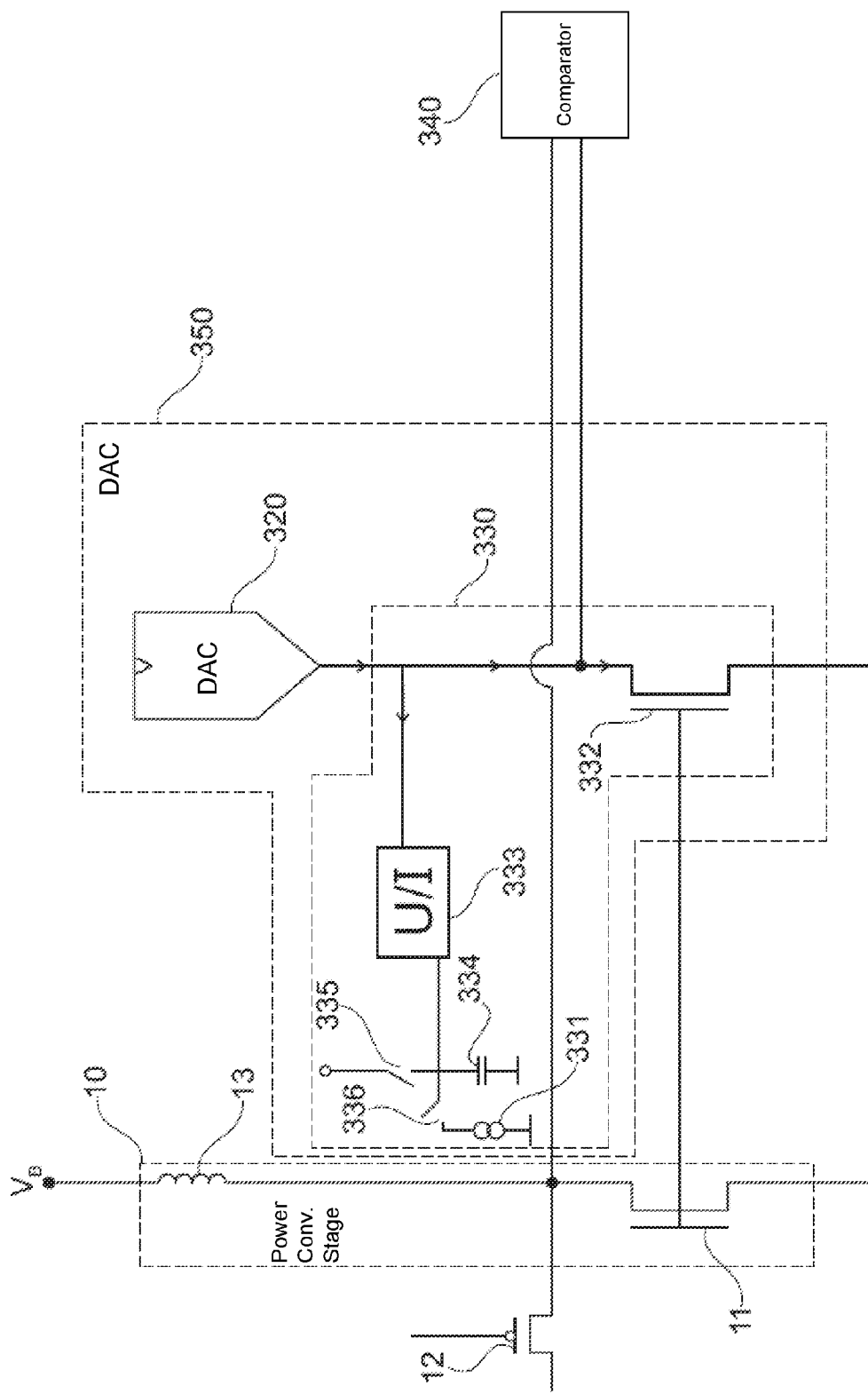
FIG. 4 illustrates a schematic block representation of a digital to analog converter for a digitally controlled current mode converter according to the disclosure.

FIG. 4 shows a schematic block representation of a digital to analog converter 350 for a power converter according to the disclosure. The digital to analog converter 350 of FIG. 4 is to be understood in the same way as the power converter of FIG. 1 wherein some elements are not shown in FIG. 4 for the sake of simplicity. The digital to analog converter 350 of FIG. 4 comprises a power converter stage 10 comprising a first switch 11, a second switch 12, and an inductor 13, wherein the output capacitor is not shown. The digital to analog converter 350 of FIG. 4 further comprises a DAC 320 (first sub-DAC) and a slope compensation circuit 330. The power converter further comprises a comparator 340. The slope compensation circuit 330 comprises a current source 331 (second sub-DAC), a replica element, e.g. a first switch 332, a voltage-current converter 333, a capacitor 334, a second switch 335, and a third switch 336. The DAC 320 is comparable to the DAC 20 of FIG. 3 and it injects a current into the first switch 332 which functions as a replica device with respect to the first switch 11 of the power converter stage 10. Again the first switch 11 may comprise a transistor or a resistor to convert the current of the DAC 320 into a voltage. Then a combined effect between the current source 331, the capacitor 334 and the voltage-current converter 333 generates a current ramp which can be added to or subtracted from the analog current as supplied by the DAC 320. The second switch 335 serves to reset the circuit at the end of one switching cycle. The third switch 336 deactivates the current source 331 during this reset phase. The resulting current $I_{DAC}-I_{RAMP}$ generates a voltage drop across the replica device 332 which is supplied to a first input of comparator 340 wherein the coil current flowing through the inductor 13 of the power converter stage 10 is supplied to a second input of the comparator 340. As soon as the two signals input to the comparator 340 are equal, an output signal is generated and supplied to the controller 70 which reacts by closing the first switch 11.

Figure 5:
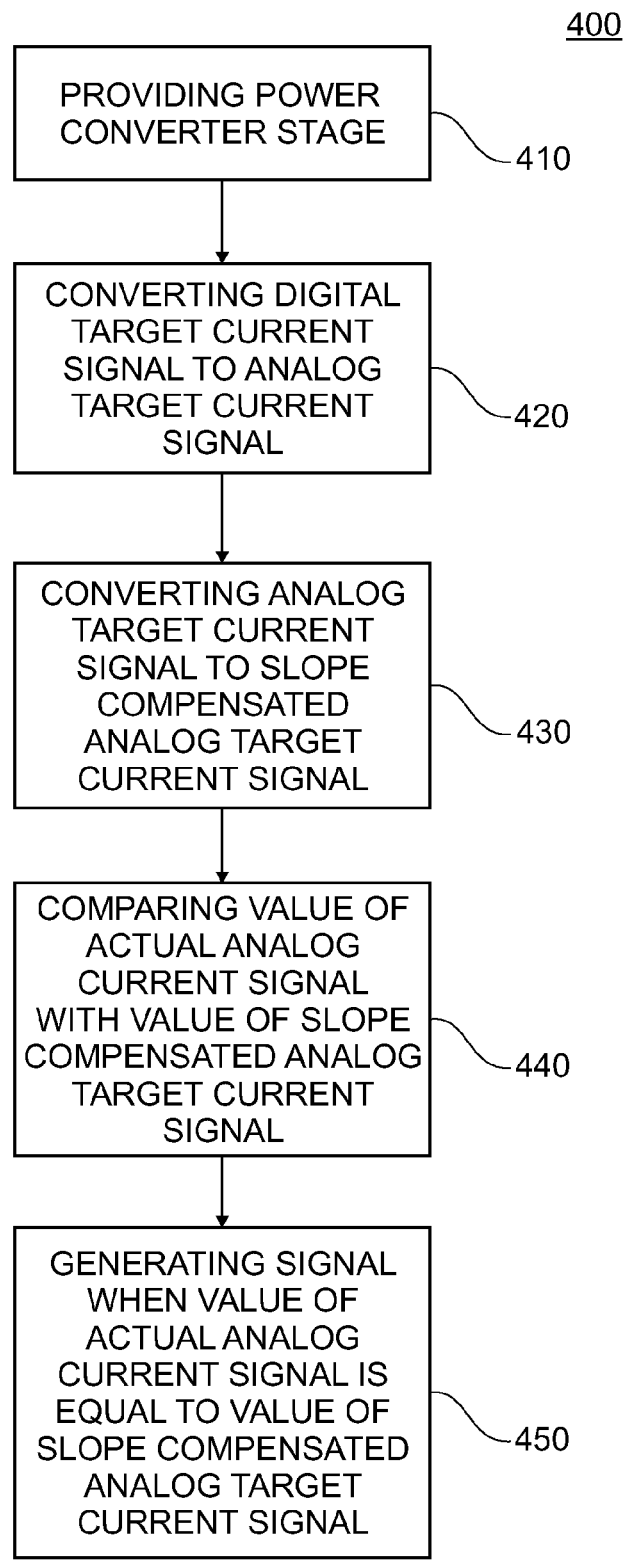
FIG. 5 illustrates a flow diagram of an exemplary method for digitally controlling a current mode power converter according to the disclosure.

FIG. 5 shows a flow diagram of a method for digitally controlling a current mode power converter. The method 400 of FIG. 5 comprises providing a power converter stage at 410, converting a digital target current signal to an analog target current signal at 420, and converting the analog target current signal to a slope compensated analog target current signal at 430. The method further comprises comparing a parameter representative of an actual analog current signal obtained from the power converter stage with a parameter representative of the slope compensated analog target current signal at 440, and generating a signal when a value of the actual analog current signal is equal to a value of the slope compensated analog target current signal at 450. The digital target current signal may be derived from a measurement of an output voltage of the power converter stage.

The parameter representative of an actual analog current signal may be the actual analog current signal itself or a voltage representative of the actual analog current signal, and the parameter representative of the slope compensated analog target current signal may be the slope compensated analog target current signal itself or a voltage representative of the slope compensated target current signal.

According to an embodiment of the method, converting the analog target current signal to a slope compensated analog target signal comprises reducing or increasing a value of the analog target current signal. In particular, it comprises generating a ramp current signal which can be done, for example, by charging a capacitor by means of a current source. The current source can be implemented as an adjustable current source, in particular in the form of a digital-to-analog converter.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. A digitally controlled current mode power converter, comprising:
   a power converter stage;
   a digital-to-analog converter comprising an input and an output and configured to receive a digital target current signal at the input and output an analog target current signal at the output;
   a slope compensation circuit comprising an input and an output, wherein the input is coupled to the output of the digital-to-analog converter and is configured to receive the analog target current signal therefrom, and wherein the slope compensation circuit is configured to output a slope compensated analog signal at the output, wherein the slope compensation circuit comprises a current source, a replica element, and a capacitor, wherein the capacitor comprises a first electrode and a second electrode, wherein the first electrode is coupled to a node between the digital-to-analog converter and the replica element, and the second electrode is coupled to the current source, wherein the capacitor is configured to subtract a ramp signal from the analog target current signal to generate the slope compensated analog signal; and
   a comparator comprising a first input, a second input, and an output, wherein the first input is coupled to the power converter stage and is configured to receive an actual analog signal therefrom, the second input is coupled to the output of the slope compensation circuit, and the comparator is configured to output a signal when a value of the actual analog signal is equal to a value of the slope compensated analog signal.

2. The digitally controlled current mode power converter according to claim 1, wherein the power converter stage comprises a first switch, a second switch, an inductor, and a capacitor.

3. The digitally controlled current mode power converter according to claim 2, wherein the first input of the comparator is coupled to the inductor and is configured to receive the actual analog signal via the inductor.

4. The digitally controlled current mode power converter according to claim 1, further comprising:
   a controller coupled to the digital-to-analog converter and configured to generate the digital target current signal and supply the digital target current signal to the digital-to-analog converter.

5. A current mode converter, comprising:
   a converter stage comprising a first switch, a second switch, an inductor, and a capacitor;
   a digital-to-analog converter configured to convert a digital target current signal to an analog current signal;
   a slope compensation circuit coupled to the digital-to-analog converter and configured to convert the analog current signal to a slope compensated analog target signal, wherein the slope compensation circuit comprises an adjustable current source, a switch, and a capacitor, wherein control electrodes of the first switch and the switch of the slope compensation circuit are coupled to a common signal line, wherein the capacitor comprises a first electrode and a second electrode, wherein the first electrode is coupled to a node between the digital-to-analog converter and the replica element, and the second electrode is coupled to the current source, wherein the capacitor is configured to subtract a ramp signal from the analog current signal to generate the slope compensated analog target signal; and a comparator coupled to the converter stage and the slope compensation circuit and configured to generate and output a signal when a value of an actual analog signal is equal to a value of the slope compensated analog target signal.

6. The current mode converter according to claim 5, wherein the adjustable current source is configured as a digital-to-analog converter.

7. The current mode converter according to claim 5, wherein the first switch and a switch of the slope compensation circuit comprise a predetermined ratio of resistance values.

8. The current mode converter according to claim 5, wherein the current mode converter comprises one or more of a buck converter, a boost converter, a buck-boost converter, a DC-DC converter, an AC-DC converter, and a DC-AC converter.

9. A method for digitally controlling a current mode power converter, the method comprising:

providing a power converter stage;

converting a digital target current signal to an analog target current signal;

converting the analog target current signal to a slope compensated analog target current signal, wherein converting the analog target current signal comprises employing a capacitor to subtract a ramp signal from a voltage associated with the analog target current signal; and comparing a value of an actual analog current signal obtained from the power converter stage with a value of the slope compensated analog target current signal; and generating a signal when a value of the actual analog current signal is equal to a value of the slope compensated analog target current signal.

10. The method according to claim 9, the method further comprising:

converting the analog target current signal to the slope compensated analog target current signal comprises reducing a value of the analog target current signal.

* * * * *